United States Patent
Yamashita

(10) Patent No.: US 7,101,199 B2
(45) Date of Patent: Sep. 5, 2006

(54) ELECTRICAL CONNECTION BOX

(75) Inventor: Hisanobu Yamashita, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/092,732

(22) Filed: Mar. 30, 2005

(65) Prior Publication Data
US 2005/0233618 A1 Oct. 20, 2005

(30) Foreign Application Priority Data
Apr. 19, 2004 (JP) ............................. 2004-123243

(51) Int. Cl.
*H01R 12/00* (2006.01)
(52) U.S. Cl. .................................................. 439/76.6
(58) Field of Classification Search ............. 439/76, 439/76.2, 74; 326/90; 345/92
See application file for complete search history.

(56) References Cited

U.S. PATENT DOCUMENTS 3,283,170 A * 11/1966 Buie ........................... 326/90
5,798,744 A * 8/1998 Tanaka et al. ................ 345/92

FOREIGN PATENT DOCUMENTS

JP         A 2003-164039         6/2003

* cited by examiner

*Primary Examiner*—J. F. Duverne
(74) *Attorney, Agent, or Firm*—Oliff & Berridge, PLC

(57) ABSTRACT

An electrical connection box includes a plurality of circuit components at least partially overlapped one above the other and substantially parallel with each other each circuit component having a substrate including a switching member and an electric power conducting path; and a supporting member that retains the circuit components. The switching member capable of attaching and detaching is arrayed on an upper plane of an upper substrate. The electric power conducting path of a lower circuit component is provided with a terminal connectable by extending above the upper substrate with the switching member.

11 Claims, 10 Drawing Sheets

ELECTRICAL CONNECTION BOX

BACKGROUND OF THE INVETION

1. Field of the Invetion

The present invention relates to an electrical connection box.

2. Description of the Related Art

In JP-A-2003-164039, known is an electrical connection box constructed with a control circuit substrate, a switching member arrayed on the surface of the control circuit substrate and controlled by the control circuit substrate and an electric power conducting path arrayed on the back of the control circuit substrate and connected with a power source.

SUMMARY OF THE INVETION

Since a relatively large electric current flows through an electric power conducting path in this type of electrical connection box, it must be structured to occupy a larger installation space such as broader metal plates. Therefore, a larger number of branch circuits and poles used in the electric power conducting path will inevitably require a greater space for installing electric power conducting paths, resulting in a larger-sized control circuit substrate.

The present invention has been made on the basis of the above circumstances. It is an object of the invention to make an electrical connection box smaller.

According to one aspect of the invention, there is provided with an electrical connection box includes a plurality of circuit components at least partially overlapped one above the other and substantially parallel with each other each circuit component having a substrate including a switching member and an electric power conducting path; and a supporting member that retains the circuit components. The switching member capable of attaching and detaching to the substrate is arrayed on an upper plane of an upper substrate. The electric power conducting path of a lower circuit component is provided with a terminal connectable to the switching member by extending above the upper substrate.

One sheet of a substrate can be made smaller because the substrate is divided into plural pieces so that they can be overlapped one above the other, thereby making the electrical connection box smaller as a whole. In addition, since the electric power conducting path of the lower circuit component is provided with a terminal extending above the upper substrate and attachable and detachable switching members are arrayed in a concentrated manner on the upper plane of the upper substrate, the switching members can be easily attached or detached.

According to another aspect of the invention, the upper substrate has a positioning hole that allows the terminal to penetrate.

By thus configuration, a terminal is allowed to penetrate through the positioning hole, by which the terminal can be positioned in relation to the upper substrate and the attachable and detachable switching members.

According to another aspect of the invention, the supporting member has through-holes that allow a plurality of the terminals to penetrate individually.

By thus configuration, plural terminals are individually accommodated into the through-hole, thus making it possible to avoid accidental short-circuits of terminals even when the terminals are adjacent to each other.

BRIEF DESCIRPTION OF THE DRAWINGS

DESCRIPTION OF THE PREFERRED EMBODIMENTS

Embodiment 1

Hereinafter, the Embodiment 1 of the present invention will be explained by referring to FIG. 1 through FIG. 13. The electrical connection box of the present embodiment is structured so that the first circuit component 10 (an upper circuit component) and the second circuit component 30 (a lower circuit component) are overlapped one above the other in a horizontal manner and accommodated into the case 40.

Figure 1:
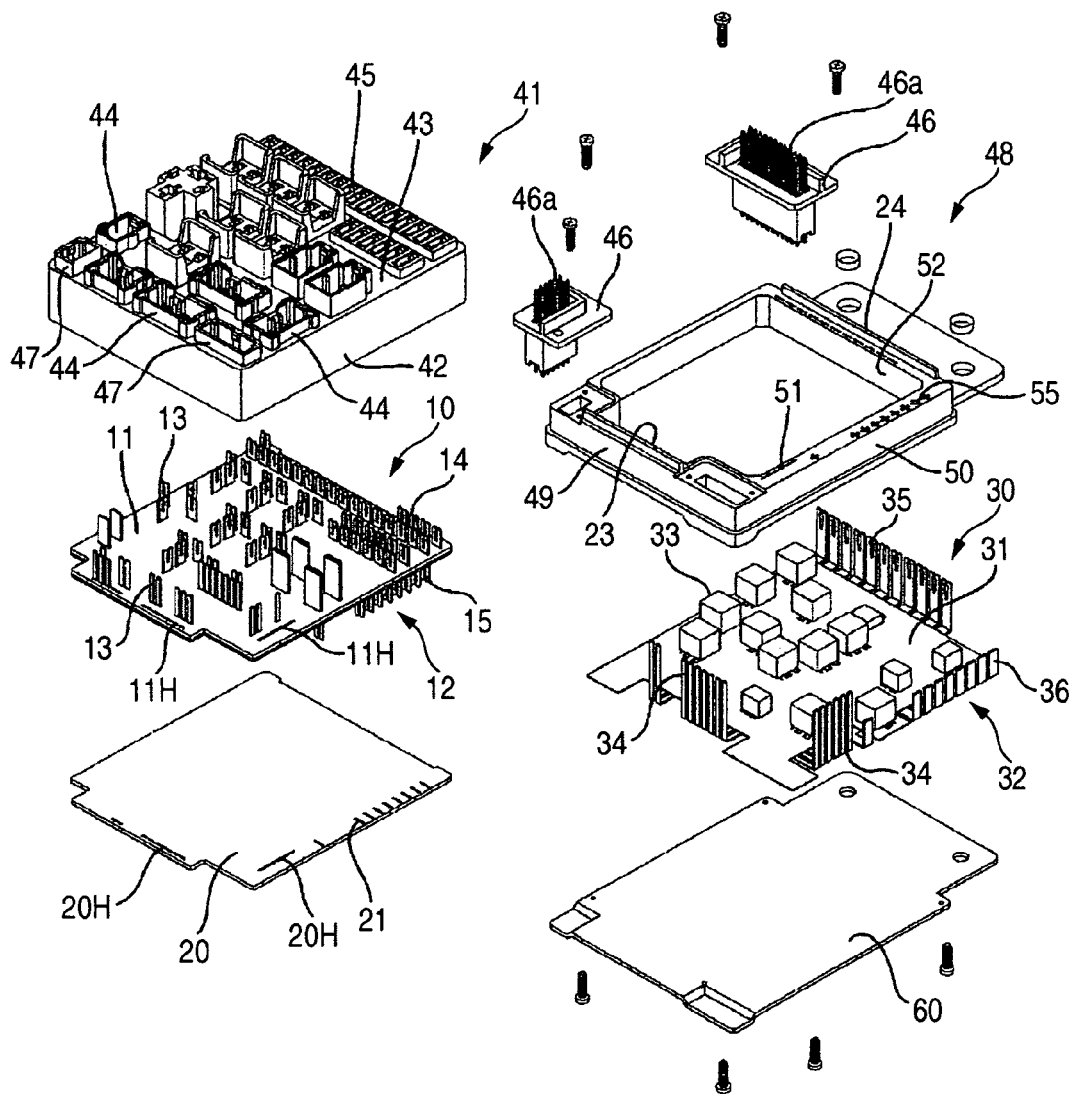
FIG. 1 is an exploded perspective view.
Figure 2:
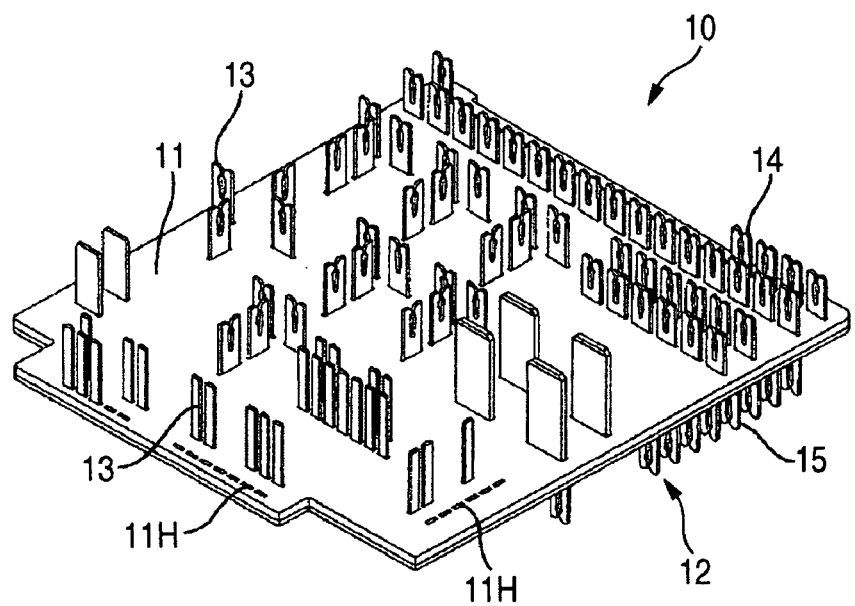
FIG. 2 is a perspective view of the first circuit component.
Figure 3:
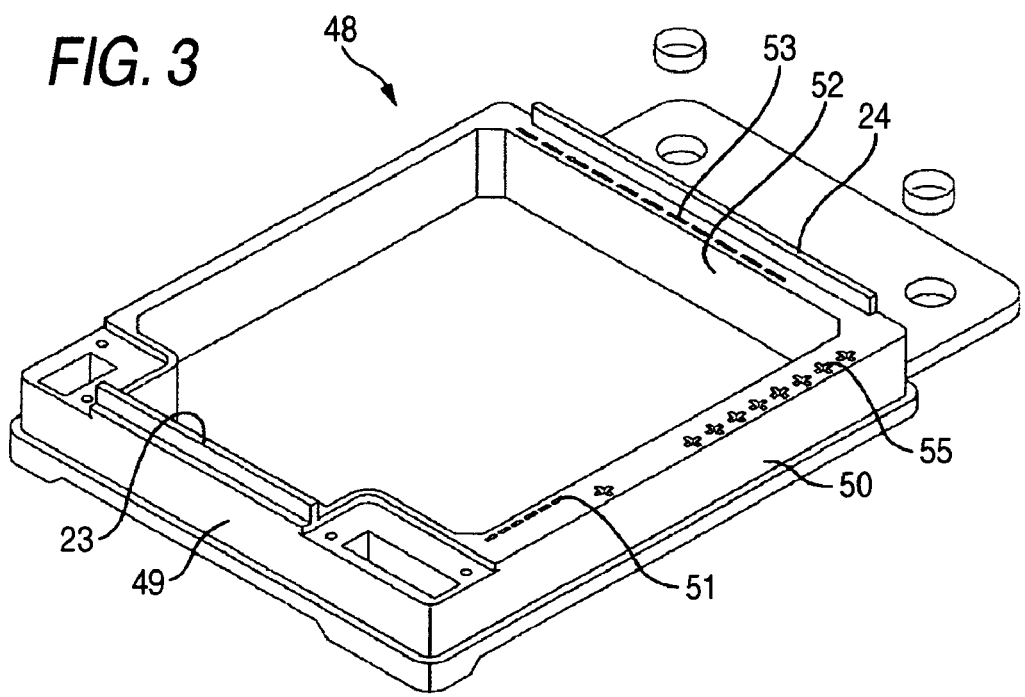
FIG. 3 is a perspective view of the frame of the case.
Figure 4:
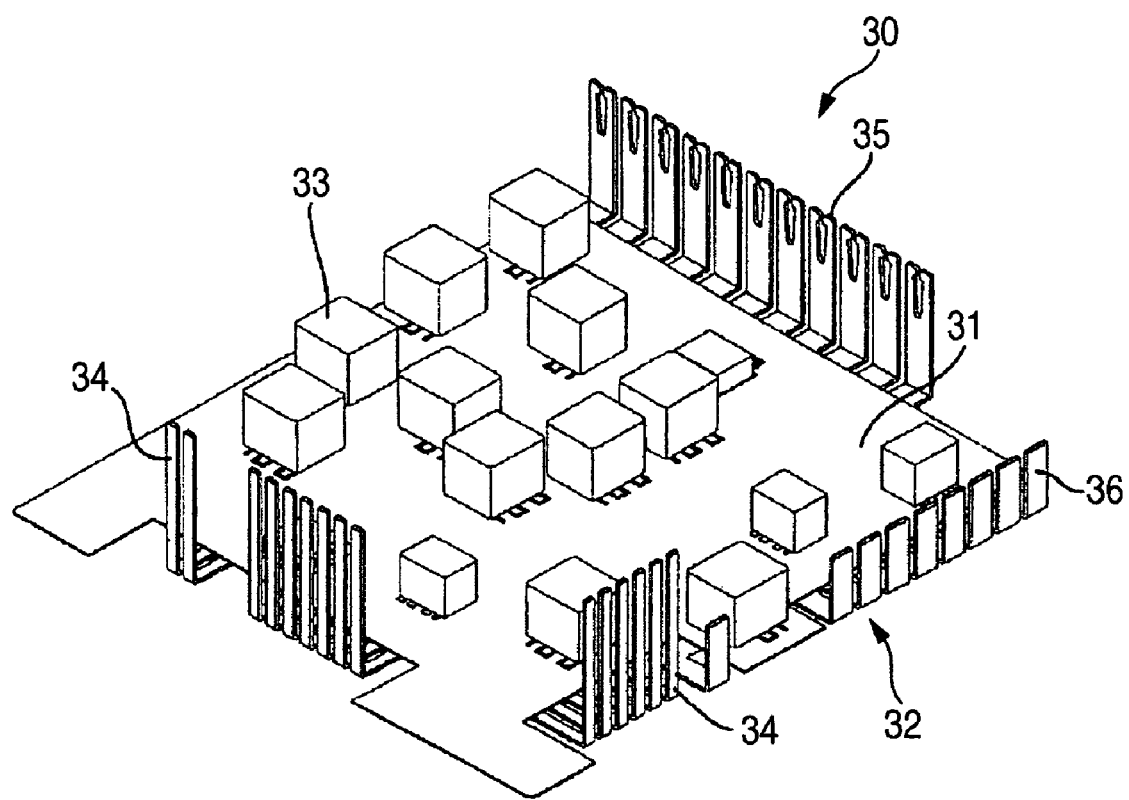
FIG. 4 is a perspective view of the second circuit component.
Figure 5:
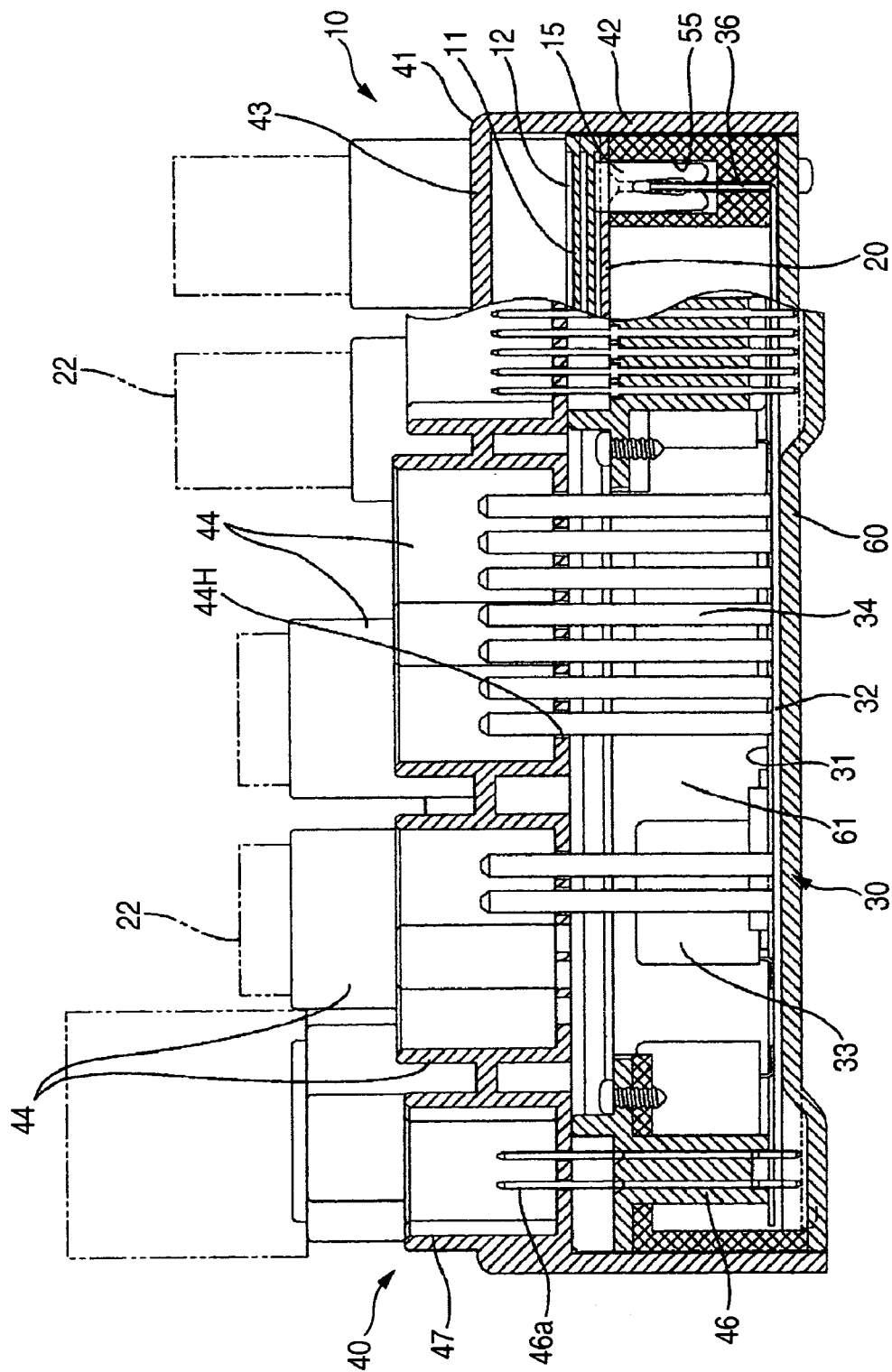
FIG. 5 is a sectional view.
Figure 6:
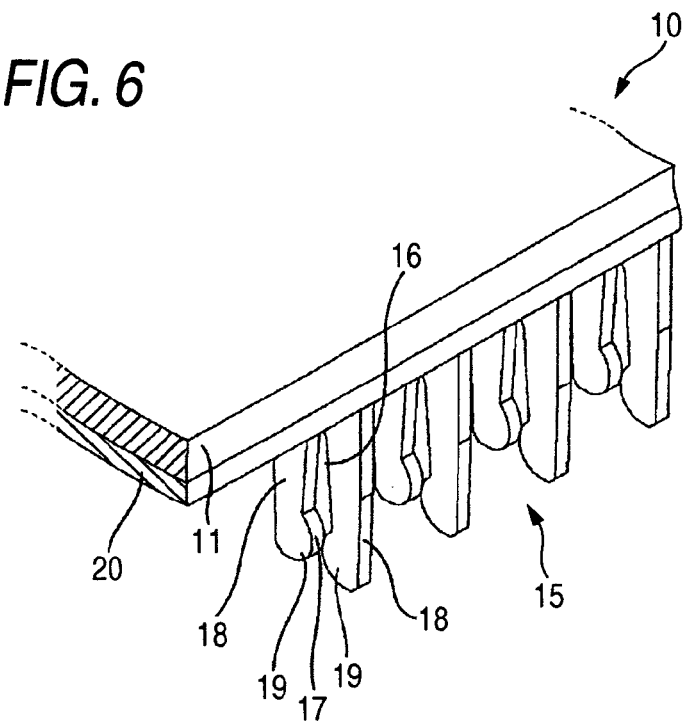
FIG. 6 is a perspective view showing the tuning-fork shaped terminal.
Figure 7:
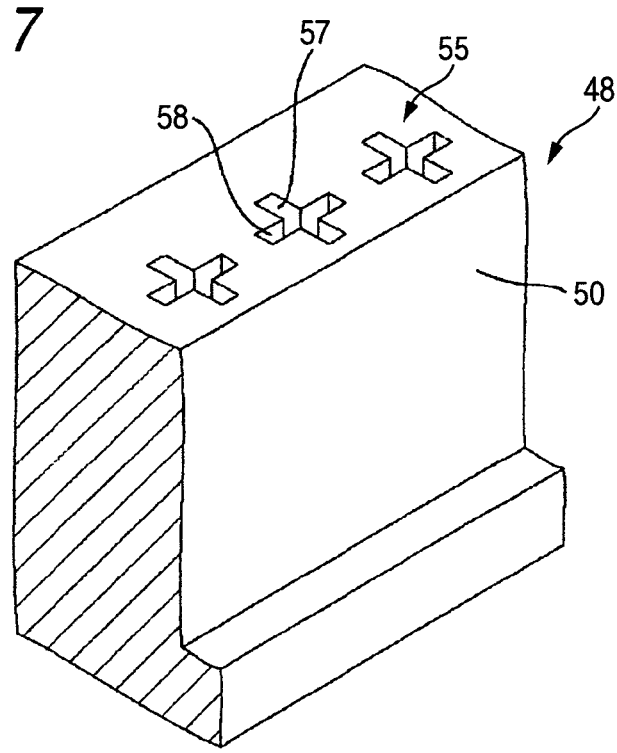
FIG. 7 is a perspective view showing the positioning part.
Figure 8:
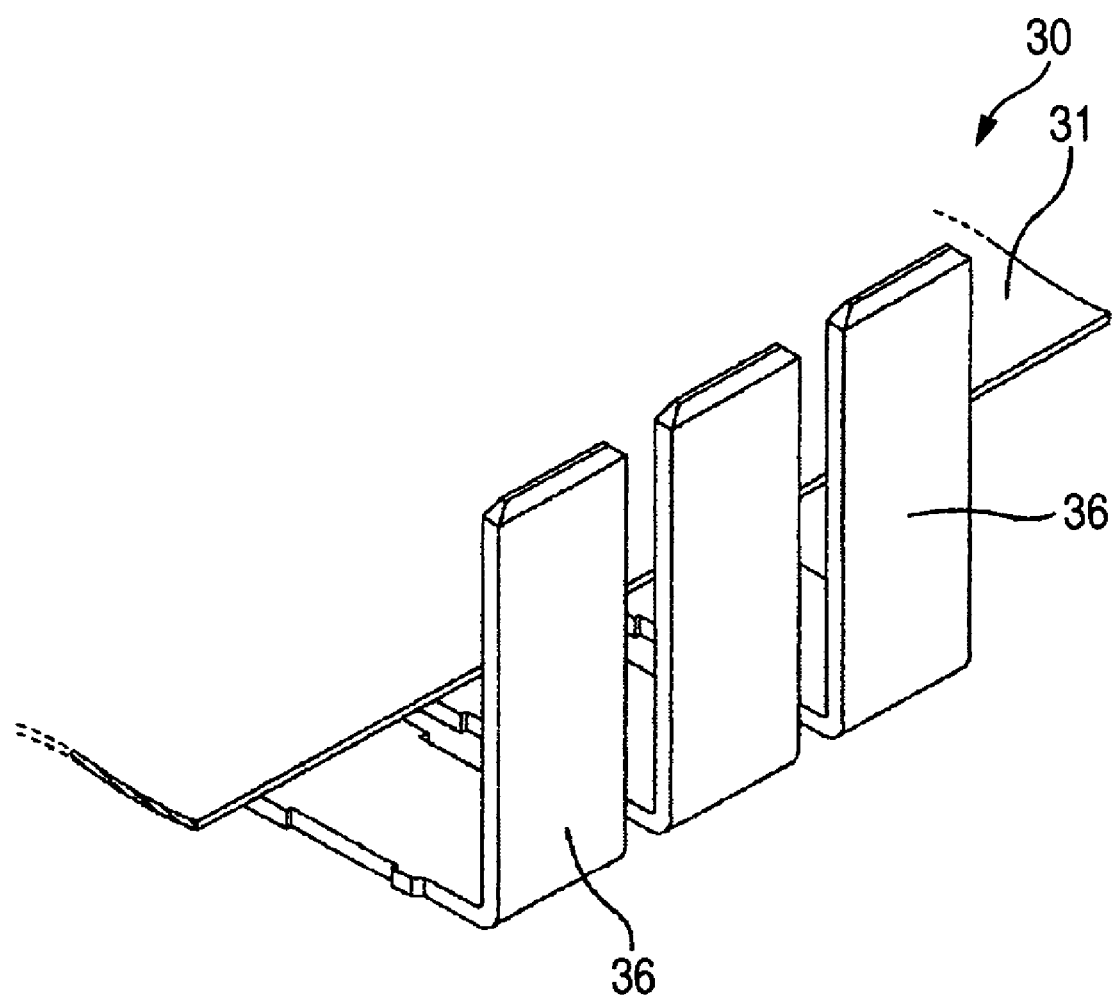
FIG. 8 is a perspective view showing the tab terminal.
Figure 9:
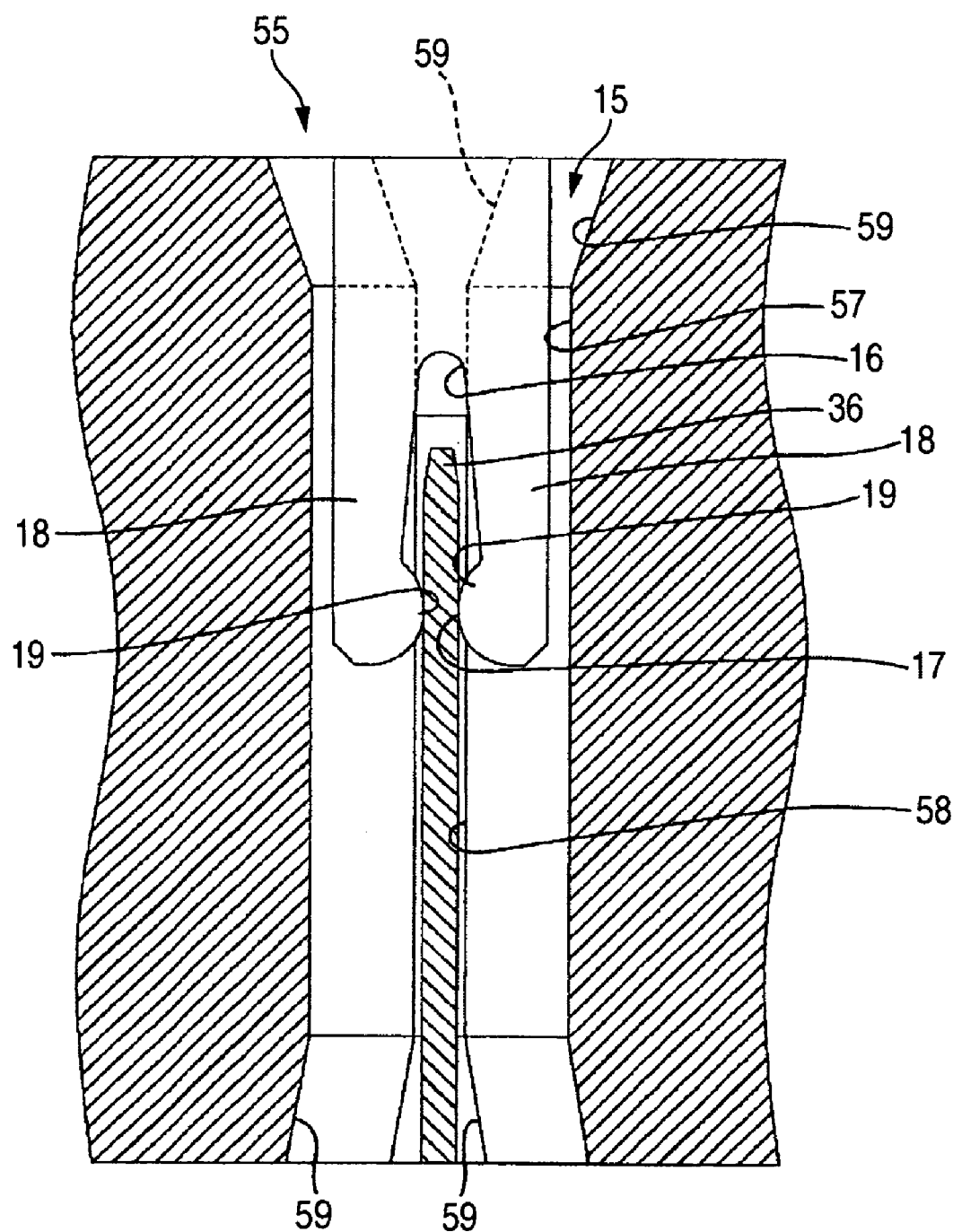
FIG. 9 is a enlarged sectional view showing a state that the tuning-fork shaped terminal is fitted into the tab terminal.
Figure 10:
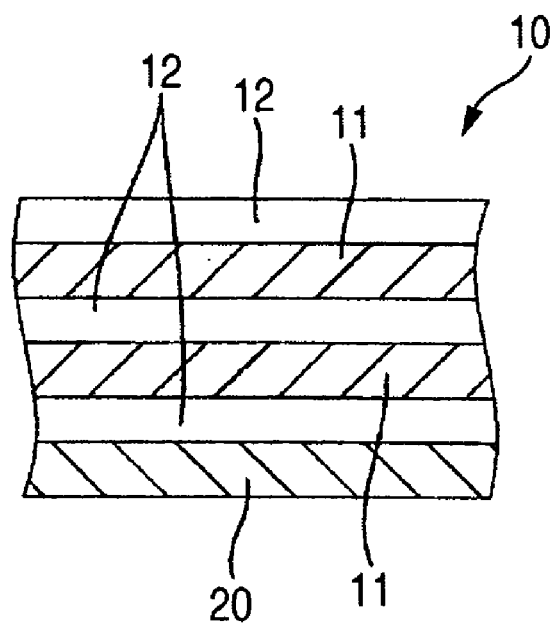
FIG. 10 is a partially-enlarged sectional view of the structure where the first circuit component is adhered to the insulating plate.

The first circuit component 10 is provided with the approximately rectangular supporting substrate 11 (as the upper substrate), the first electric power conducting path 12 arrayed along the supporting substrate 11 and the relay 22 (attachable and detachable switching member) attached to the upper cover 41 which will be explained later. As illustrated in FIG. 10, the supporting substrate 11 is divided into two layers above and below. In addition, the first electric power conducting path 12 is composed of a plurality of bus bars made with a thick metal sheet punched out into a predetermined shape and divided into three layers above and below. The first electric power conducting path 12 (top layer) is adhered to the upper plane (surface) of the upper supporting substrate 11, and the first electric power conducting path 12 (intermediate layer) and the first electric power conducting path 12 (bottom layer) are respectively adhered to both the upper and the lower planes (surface and back) of the lower supporting substrate 11. Plural relay terminals 13 penetrating through the supporting substrate 11 and projecting to the upper plane (surface) at an approximately right angle, plural fuse terminals 14 penetrating through the supporting substrate 11 and projecting to the upper plane (surface) at an approximately right angle and plural tuning-fork shaped terminals 15 projecting downward from the lower plane of the supporting substrate 11 at an approximately right angle, are formed in a integrated manner in the first electric power conducting path 12.

The tuning-fork shaped terminal 15 is in a vertically-long band plate form (tab shape) as a whole and arrayed in a line at a predetermined pitch back and forth along the left edge on the peripheral edge of the supporting substrate 11. The tuning-fork shaped terminal 15 is provided with the notch part 16 which is notched upward from the lower facing toward the longitudinal direction (in parallel in the direction that it is fitted into the tab terminal 36). A longitudinal-direction opening of this notch part 16 is made gradually wider from the top to the bottom, except for the lower end part, and made narrower at the admission part 17 on the lower end of the notch part 16. In other words, parts on both the right and the left sides of the notch part 16 at the tuning-fork shaped terminal 15 are a pair of holding strips 18 extended out downward in a cantilevered form. The side edge on the notch part 16 at the lower end part of each holding strip 18 is the guidance part 19 extended out (projected) to the opposite holding strip 18 in a circular form, and the pair of the guidance parts 19 constitute the admission part 17 of the notch part 16.

The insulating plate 20, one piece of a plate covering a whole dimension of the supporting substrate 11, is adhered to the lower plane of the supporting substrate 11, or the lower plane of the first electric power conducting path 12 (bottom layer) in a state of being closely overlapped by the use of an adhesive agent (not illustrated here). This insulating plate 20 is provided for regulating heat conduction between the upper first circuit component 10 and the lower second circuit component 30, and constituting a wall partitioning the sealed space 61 to be explained later. The insulating plate 20 is made with materials lower in heat conductivity, for example, synthetic resins mainly composed of high-polymer materials such as polyethylene. Said insulating plate 20 is also electrically insulative. The insulating plate 20 is also provided with plural through-holes 21, through which the tuning-fork shaped terminals 15 penetrate, in a horizontal deflection being regulated. In other words, the tuning-fork shaped terminals 15 project downward from the insulating plate 20.

The supporting substrate 11 is penetrated vertically by a plurality of slit-line positioning holes 11H in such a way that they are arrayed in a line along the front edge and the left edge of the supporting substrate. These positioning holes 11H are holes for allowing the relay terminal 34 of the second circuit component 30 to be explained later to penetrate in a case where the terminal is positioned firmly. The positioning holes 20H for allowing the relay terminal 34 of the second circuit component 30 to penetrate in a case where the terminal is positioned firmly are also formed on the insulating plate 20 in such a way that they are arrayed in a line in correspondence with the positioning holes 11H of the supporting substrate 11 and also attaining a vertical penetration.

Figure 11:
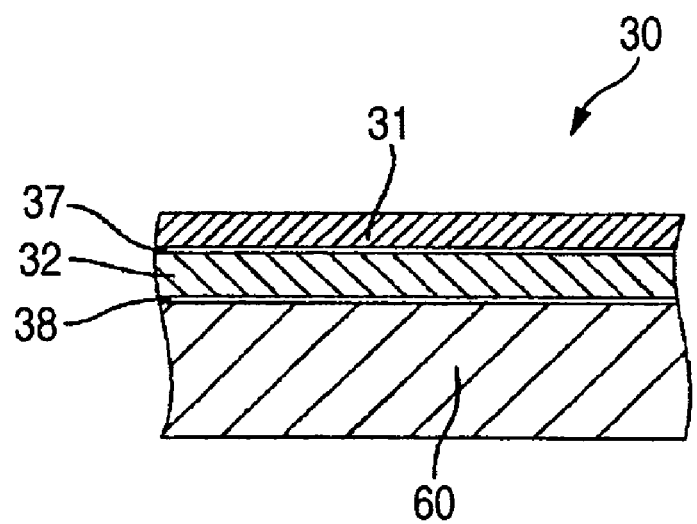
FIG. 11 is a partially-enlarged sectional view of the structure where the second circuit component is adhered to the radiator plate.
Figure 12:
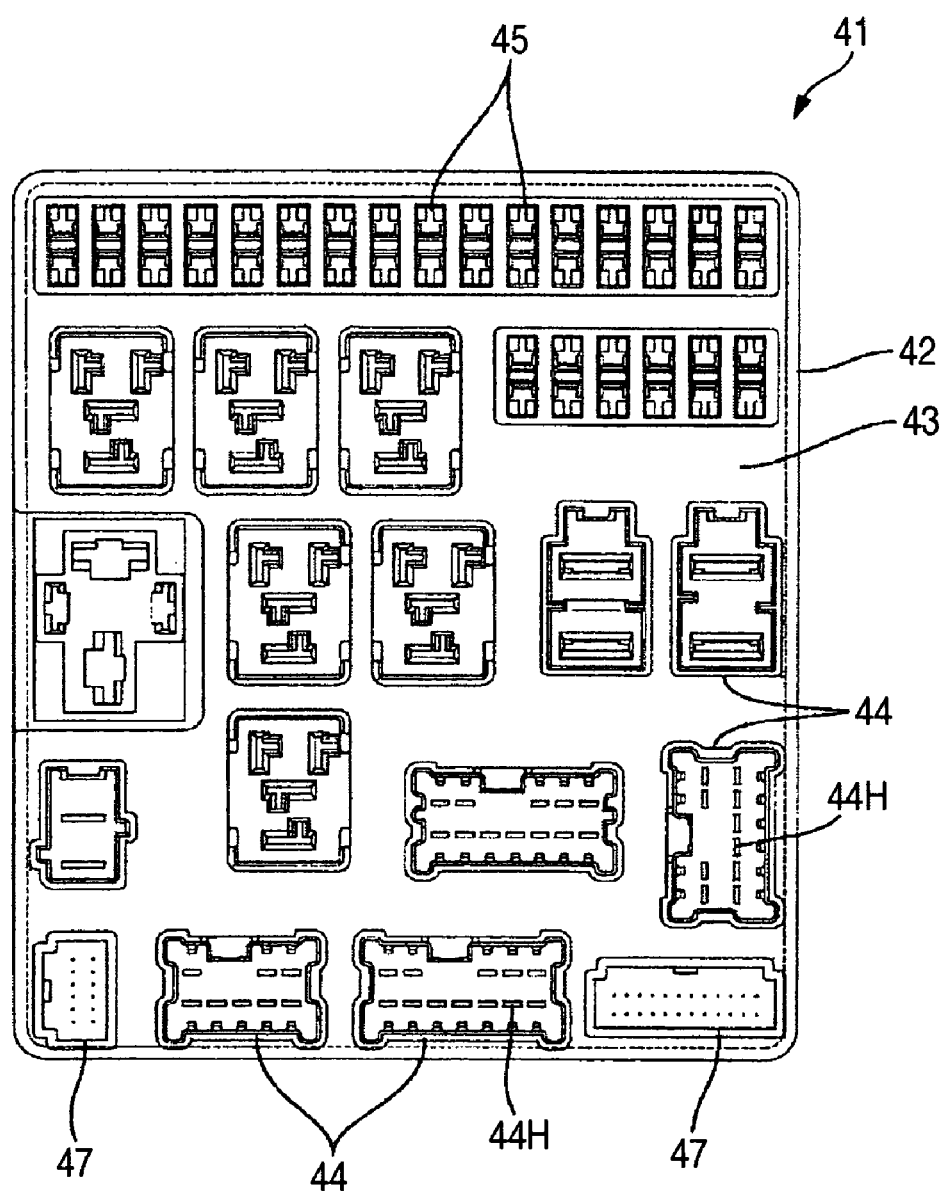
FIG. 12 is a plain view of the upper cover.
Figure 13:
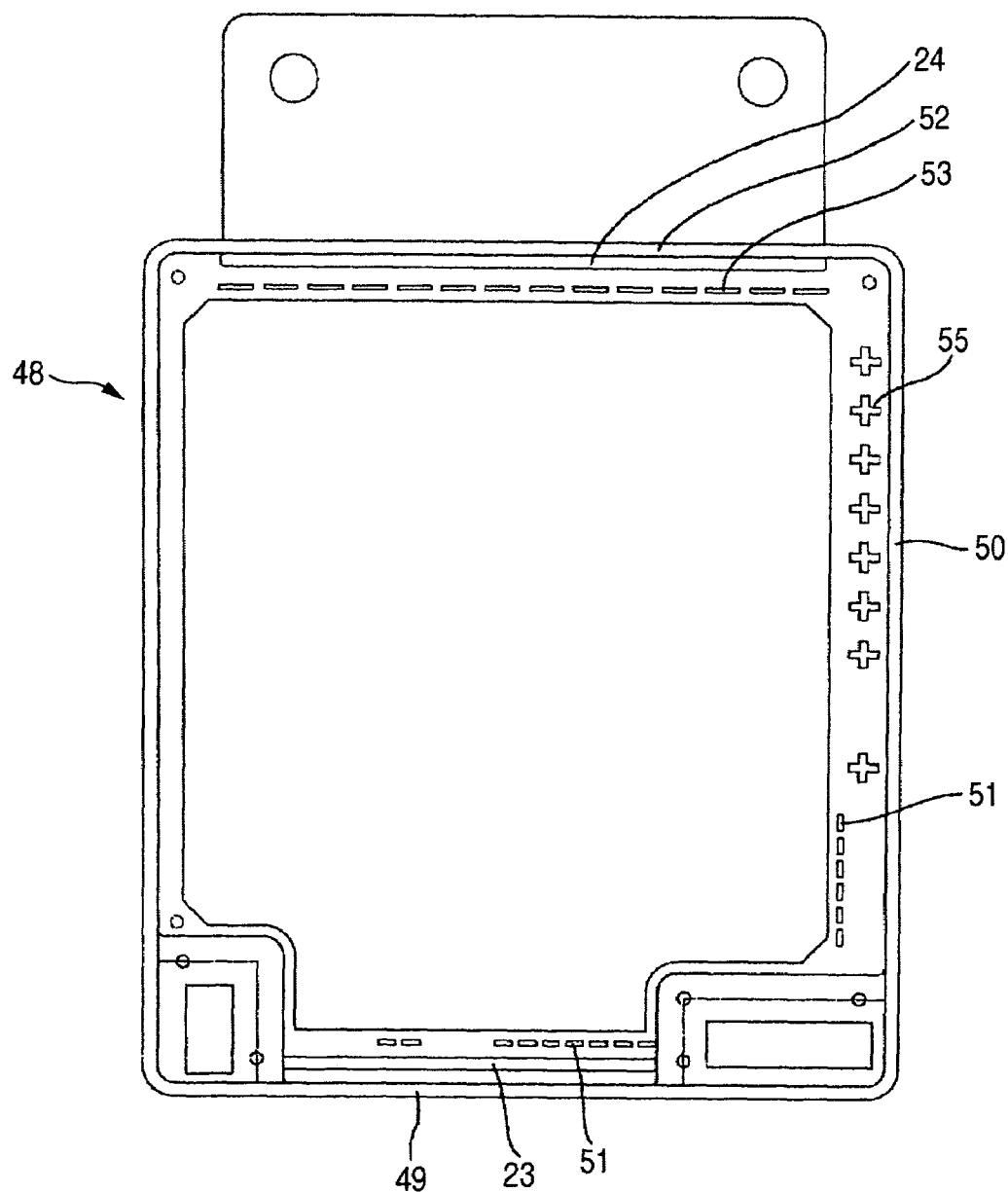
FIG. 13 is a plain view of the frame.

The second circuit component 30 is provided with the approximately rectangular control circuit substrate 31, the second electric power conducting path 32 arrayed along the lower plane of the control circuit substrate 31 and the semiconductor switching element 33 (as switching member) projected on the upper plane (surface) of the control circuit substrate 31. The second electric power conducting path 32 consists of plural bus bars made with a thick metal sheet punched out into a predetermined shape. As illustrated in FIG. 11, it is electrically insulative to the lower plane of the control circuit substrate 31 and adhered so as to contact with the plane through an adhesive agent or a thin adhesive sheet 37 high in heat conductivity and in close proximity thereto. Plural relay terminal 34 projecting at an approximately right angle to the upper plane (surface) along the front edge and the left edge on the peripheral edge of the control circuit substrate 31, plural fuse terminals 35 projecting at an approximately right angle to the upper plane (surface) along the back edge on the peripheral edge of the control circuit substrate 31 and plural tab terminals 36 projecting at an approximately right angle to the upper plane (surface) along the left edge on the peripheral edge of the control circuit substrate 31 are formed in an integrated manner in the second electric power conducting path 32.

The tab terminal 36 is in a vertically-long band plate form (tab shape) and arrayed in a line at a predetermined pitch back and forth along the left edge on the peripheral edge of the control circuit substrate 31, that is in a form corresponding to the tuning-fork shaped terminal 15. The upper edge of the tab terminal 36 faces the back and forth direction so as to give a right angle to the lower edge of the tuning-fork shaped terminal 15. Further, the plate thickness dimension of the tab terminal 36 is to be equal to or slightly larger than an opening width (namely, a pitch between the guidance parts 19 of the holding strip 18) of the admission part 17 at the notch part 16 of the tuning-fork shaped terminal 15.

As with the tab terminal 36, the relay terminal 34 is in a vertically-long band plate form (tab shape) and arrayed in a line at a predetermined pitch back and forth along the front edge and the left edge on the peripheral edge of the control circuit substrate 31.

The case 40 is structurally provided with the upper cover 41, the frame 48 (as supporting member) and the radiator plate 60.

The upper cover 41 is made with a synthetic resin, consisting of the approximately rectangular encircling wall 42 which encircles all the circumference of the first circuit component 10 and the second circuit component 30 and the upper plane plate 43 which covers the first circuit component 10 from the top, with the inner space of the upper cover 41 opened downward. The upper plane plate 43 is provided with plural relay fixing parts 44 which are formed in a rectangular tubular form and pointed upward. The relays 22 which are formed in a block are individually fitted into the relay fixing parts 44 in a detachable manner. In addition, the relay terminal 13 of the first electric power conducting path 12 and the relay terminal 34 of the second electric power conducting path 32 approach inside the relay fixing part 44, penetrating the through-hole 44H at the bottom, and the relays 22 attached to the relay fixing part 44 are connected to the relay terminals 13 and 34.

In addition, the upper plane plate 43 is provided with plural fuse fixing parts 45 arrayed in a concave manner along the back edge. The fuse terminal 14 of the first electric power conducting path 12 approaches inside the fuse fixing part 45, penetrating through the bottom, and the fuse (not illustrated here) attached to the fuse fixing part 45 is connected to the fuse terminal 14. The upper plane plate 43 is also provided with the tubular fitting part 47 corresponding to the wire harness connector 46 to be explained later.

The frame 48 is made with a synthetic resin, available in an approximately rectangular form which encircles the circumference of the second circuit component 30, with both the upper and lower planes opened (vertically penetrated structure). Of frame parts in all directions constituting the frame 48, the front edge frame part 49 and the left edge frame part 50 of the frame 48 are provided with the through-holes 51 for allowing the relay terminals 34 of the second circuit component 30 to penetrate in a case where the relay terminals are positioned individually and fixed without rattle. Further, the back edge frame part 52 of the frame 48 is provided with the through-holes 53 for allowing the fuse terminals 35 of the second circuit component 30 to penetrate.

The front edge frame part 49 of the frame 48 is provided with the positioning rib 23 for regulating a relative deflection of the frame 48 toward the front of the first circuit component 10 by allowing the supporting substrate 11 of the first circuit component 10 to contact from the back. Further, the back edge frame part 52 of the frame 48 is provided with the positioning rib 24 for regulating a relative deflection of the frame 48 toward the back and the right or left direction of the first circuit component 10 by allowing the supporting substrate 11 of the first circuit component 10 to contact from the front as well as from both the right and left directions.

The left edge frame part 50 of the frame 48 is provided with plural positioning parts 55 for accommodating the tab terminal 36 and the tuning-fork shaped terminal 15. These positioning parts 55 are in a hole shape of penetrating through the right edge frame part 50 vertically or in parallel with the direction that the tuning-fork shaped terminal 15 is fitted into the tab terminal 36, and an inner part of each positioning part 55 is an accommodating space 56. The accommodating space 56 of each positioning part 55 is connected in a non-communicative manner with the accommodating space 56 of other positioning spaces 55, and the accommodating spaces 56 adjacent in the back and forth direction are, therefore, partitioned by a wall constituting the right edge frame part 50.

These accommodating spaces 56 are individually available in a cross-like figure, when viewed from the direction that the terminal 15 is fitted into the terminal 36, in other words, the first space 57 formed in a slit shape in the back and forth direction and the second space 58 formed in a slit shape in the longitudinal direction are intersected in an approximately right angle. Of these accommodating spaces 56, the tuning-fork shaped terminal 15 is fitted from above into the first space 57 formed in the longitudinal direction, and the thus fitted tuning-fork shaped terminal 15 is regulated for the deflection made in the back and forth direction or in the longitudinal direction in relation to the frame 48 by contacting with the inner wall of the first space 57, and the notch part 16 of the tuning-fork shaped terminal 15 corresponds with the space in the back and forth direction. Further, the tab terminal 36 is fitted from below into the second space 58 in the back and forth direction in the accommodating space 56, and the thus fitted tab terminal 36 is regulated for the deflection made in the back and forth direction or in the longitudinal direction in relation to the frame 48 by contacting with the inner wall of the second space 58. Inside the accommodating space 56 (positioning part 55), the upper end part of the tab terminal 36 is closely fitted into the notch part 16 of the tuning-fork shaped terminal, by which the first electric power conducting path 12 and the second electric power conducting path 32 are communicatively connected.

The taper-shaped guiding plane 59 is formed on opening edges of upper and lower ends of the accommodating space 56. Thus, even if the terminals 15 and 36 are placed into the accommodating space 56 at a slightly deviated position when the tuning-fork shaped terminal 15 and the tab terminal 36 are fitted into the accommodating space 56, the terminals 15 and 36 make contact with the guiding plane 59, by which the deviated position of the terminals 15 and 36 in the frame 48 can be corrected and the terminals 15 and 36 are guided into the accommodating space 56 without fail.

The wire harness connector 46 is fixed from above to the both right and left ends of the front edge frame part 49 of the frame 48, and the lower end part of the terminal fitting 46a of the connector 46 is connected to the control circuit substrate 31 of the second circuit component 30. The upper end part of the terminal fitting 46a of the connector 46 approaches into the tubular fitting part 47 of the upper cover 41 in preparation for connecting with the wire harness connector (not illustrated) and the terminal fitting (not illustrated).

The radiator plate 60 is made with an approximately rectangular metal plate (for example, aluminum), completely closing an opening on the lower part of the frame 48. As illustrated in FIG. 11, the radiator plate 60 is electrically insulative to the lower plane of the second electric power conducting path 32 of the second circuit component 30 and adhered so as to contact with the plane through an adhesive agent or a thin adhesive sheet 38 high in heat conductivity and in close proximity thereto. Thus, heat generated at the semiconductor switching element 33 when electricity is distributed to the second electric power conducting path 32 is effectively conducted to the radiator plate 60 through the adhesive agent or adhesive sheets 37 and 38 and the second electric power conducting path 32 and released outside (downward) the case 40.

The lower plane of the frame 48 is adhered to the upper plane of the radiator plate 60 through a water-proof seal layer (not illustrated here) in a state where the case 40 is assembled and the second circuit component 30 (including the switching element 33) is accommodated into the sealed space 61 constituted with the frame 48 and the radiator plate 60. Then, the peripheral edge part of the insulating plate 20 of the first circuit component 10 is placed on the upper plane of the frame 48 (sealed space 61), by which the second circuit component 30 inside the sealed space 61 or the sealed space 61 can be protected from water, dust and others coming outside.

The first circuit component 10 is positioned by the positioning ribs 23 and 24 in such a way that a relative deflection toward the back and forth direction or the right and left direction is regulated. The above placement and the positioning structure make it possible that the supporting substrate 11 of the first circuit component 10 is overlapped one above the other with the control circuit substrate 31 of the second circuit component 30 at a predetermined space and mutually in a parallel form, interference of the switching element 33 with the supporting substrate 11 (insulating plate 20) is avoided and the tuning-fork shaped terminal 15 is connected to the tab terminal 36 at a normal position.

Further, the lower relay terminals 34 are, respectively, through the through-hole 51 of the frame 48, the positioning hole 20H of the insulating plate 20, the positioning hole 11H of the supporting substrate 11 and the through-hole 44H of the relay fixing part 44, approaching inside the relay fixing part 44. When the relay 22 is attached to the relay fixing part 44, the relay terminal 34 is connected to the relay 22. An inner wall of the encircling wall 42 of the upper cover 41 is fitted into an outer circumference of the frame 48 almost in a firmly adhered manner. The upper cover 41 is covered above by protective cover (not illustrated here) for protecting the relays 22, fuses and connectors.

As explained above, in this embodiment, the first circuit component 10 in which the supporting substrate 11 is provided with the relay 22 and the first electric power conducting path 12 and the second circuit component 30 in which the control circuit substrate 31 is provided with the second electric power conducting path 32 and the switching element 33 are kept by the frame 48 of the case 40 so that they can be overlapped one above the other and mutually in a parallel form. A substrate is divided into plural pieces to be overlapped one above the other, and one sheet of the substrate (supporting substrate 11 and control circuit substrate 31) can be made smaller (smaller in area), thus making it possible to reduce a whole dimension of the electric connection box. Further, the supporting substrate 11 and the control circuit substrate 31 are kept mutually in an approximately parallel form and at a predetermined space, by which the electric power conducting path 12 and the electric power conducting path 32 can be connected stably with their respective counterparts.

The relay 22, a switching member fixed to the substrate in an attachable and detachable manner, is arrayed on the upper plane of the upper supporting substrate 11, and the relay terminal 34 connected by extending above the upper supporting substrate 11 to the attachable and detachable relay 22 is provided on the second electric power conducting path 32 of the lower second circuit component 30. Such constitution makes it possible that the attachable and detachable switching member (relay 22) is arrayed in a concentrated manner on the upper plane of the supporting substrate 11 and the relay 22 is attached or detached easily.

Further, since the upper supporting substrate 11 is provided with the positioning hole 11H for allowing the relay terminal 24 to penetrate in such a way that the terminal can be firmly fixed, the relay terminal 34 is penetrated through the positioning hole 11H, thus making it possible to give positioning to the relay terminal 34 in relation to the supporting substrate 11 and the relay 22.

In addition, the frame 48 is provided with through-holes 51 for allowing plural relay terminals 34 to penetrate individually, and plural relay terminals 34 are individually accommodated into the through-holes 51, thus making it possible to avoid accidental short-circuits between the relay terminals 34, even when these relay terminals 34 are mutually adjacent.

What is more, in this embodiment, the sealed space 61 is formed in the case 40, and among the two circuit components 10 and 30, the second circuit component 30 in which a switching member is constituted with the semiconductor switching elements 33 (semiconductor elements) is accommodated in the sealed space 61, thereby preventing attachment of foreign substances such as water and dust on the surface of the control circuit substrate 31 and also preventing short-circuits in a circuit of the control circuit substrate 31 due to the attachment of foreign substances.

Where the second circuit component 30 is accommodated into the sealed space 61, there is a concern that heat generated at the semiconductor switching element 33 may be kept inside the sealed space 61. However, in this embodiment, since an outer wall (lower plane wall) of the case 40 constituting the sealed space 61 is made with the radiator plate 60 high in heat conductivity, heat inside the sealed space 61 can be effectively released outside.

Further, inside the sealed space 61, the semiconductor switching element 33 is arrayed on the surface of the control circuit substrate 31, the second electric power conducting path 32 is arrayed on the back plane of the control circuit substrate 31, and the second electric power conducting path 32 is overlapped with the radiator plate 60 so as to contact on the surface. Thus, heat generated at the semiconductor switching element 33 is effectively conducted via the second electric power conducting path 32 to the radiator plate 60 and radiated outside the sealed space 61 (outside the case 40) significantly. Further, the second electric power conducting path 32 and the radiator plate 60 are adhered via an adhesive agent or adhesive sheets 37 and 38, thereby increasing the heat conductivity from the second electric power conducting path 32 to the radiator plate 60.

Where these two circuit components 10 and 30 are arrayed in a mutually overlapping manner, there is a concern that heat generated at the semiconductor switching element 33 of the lower second circuit component 30 is conducted to the upper first circuit component 10, thus resulting in an overheated condition at the first circuit component 10. In this embodiment, however, since the insulating plate 20 capable of preventing heat conduction between the first circuit component 10 and the second circuit component 30 is provided between these circuit components, there will be no overheat at the upper first circuit component 10.

Further, since the insulating plate 20 is available in a plate form, composing a wall for partitioning the sealed space 61, it is fewer in the number of parts and simplified in structure as compared with a structure in which overlapped are insulating plates separated from a wall constituting a sealed space.

When the electric power conducting path 12 with the channel 32 are connected, the tuning-fork shaped terminal 15 is provided on the upper first electric power conducting path 12, the tab terminal 36 is also provided on the lower second electric power conducting path 32, and the positioning part 55 for positioning the two terminals 15 and 36 at a normal connecting site is provided on the frame 48. Therefore, since the frame 48 positions the terminals 15 and 36, the structure can be simplified as compared with a case where a special positioning member is provided in addition to the frame 48.

The tuning-fork shaped terminal 15 and the tab terminal 36, which connects the electric power conducting paths 12 and 32, are provided so as to be adjacent to each other in a plural number. Plural tuning-fork shaped terminals 15 are individually accommodated into plural accommodating spaces 56 made in the frame 48, and plural tab terminals 36 are also individually accommodated into plural accommodating spaces 56, thereby making it possible to prevent short-circuits between the tuning-fork shaped terminals 15 and also short-circuits between adjacent tab terminals 36.

In the first embodiment, the first circuit component 10 in which the first electric power conducting path 12 is arrayed along the supporting substrate 11 and the second circuit component 30 in which the second circuit component 30 is arrayed along the control circuit substrate 31 are overlapped one above the other and mutually in an approximately parallel form and accommodated into the case 40, and the tuning-fork shaped terminals 15 of the first electric power conducting path 12 are fitted into the tab terminals 36 of the second electric power conducting path 32 one above the other so that they can be connected. Further, the frame 48 of the case 40 is provided with the positioning part 55 for regulating deflection of the terminals 15 and 36 on both the first and second circuit components toward the direction (back and forth or right and left direction) intersecting in the vertical direction (direction that the terminals 15 and the terminals 36 are fitted into their respective counterparts). Such provision of the positioning part 55 makes it possible to give positioning to plural tuning-fork shaped terminals 15 and plural tab terminals 36 all together and also to fit plural tuning-fork shaped terminals 15 into plural tab terminals 36 at the same time (all together). Further, the positioning part 55 is provided in the case 40 for accommodating the circuit components 10 and 30, thereby eliminating the necessity for the special positioning member 55.

In addition, both of the tuning-fork shaped terminal 15 and the tab terminal 36 are in a plate form (tab shape), and the tab terminal 36 is fitted into the notch part 16 formed on the tuning-fork shaped terminal 15 so that these terminals can be connected. The respective terminals 15 and 36 are available in a plate form and, therefore, simplified in structure. Further, one of the terminals (tuning-fork shaped terminal 15) is provided with the notch part 16, into which another terminal (tab terminal 36) is fitted, thereby resulting in a simplified structure where the terminals 15 and 36 are fitted respectively into their counterparts.

A plurality of the tuning-fork shaped terminals 15 and a plurality of the tab terminals 36 are adjacently arrayed in a line in the back and forth direction. In this embodiment, a wall partitioning each hole-like space 56 constituting the positioning part 55 is structured to exist between the terminals, thus making it possible to avoid short-circuits between the terminals, without providing a special short-circuit preventive member. Further, short-circuits between the terminals can be prevented more assuredly because a part at which the tuning-fork shaped terminal 15 is fitted into the tab terminal 36 is accommodated into the hole-like space 56 of the positioning part 55.

Other Embodiments

The present invention shall not be restricted to the embodiment described with reference to the above description and figures, but, for example, includes the following embodiments in the technical field of the invention. In addition, the invention can be executed in various modifications other than the examples shown below without deviating from the scope of the present invention.

(1) In the above embodiment, only one circuit component is accommodated into the sealed space. However, the present invention shall not be restricted to the above embodiment, but a plurality of circuit components may be accommodated into the sealed space.

(2) In the above embodiment, an explanation is made about a case where the number of the circuit components is 2. However, the above-embodiment of the present invention is also applicable to an electrical connection box where three or more circuit components are overlapped.

(3) In the above embodiment, the insulating member is adhered to the lower plane of the substrate on the upper circuit component. However, the embodiment of the invention includes a structure where the insulating member may be separated from the substrate.

(4) In the above embodiment, the electric power conducting path inside the sealed space is overlapped with the radiator plate so as to contact on the surface. However, the above-embodiment of the present invention may include a case where the electric power conducting path inside the sealed space may be separated from the radiator plate.

(5) In the above embodiment, only the lower plane of the sealed space is constituted with the radiator plate. However, the above-embodiment of the present invention may include a case where an area corresponding to the frame may be constituted with the radiator plate.

(6) In the above embodiment, the frame is provided with the positioning part to give positioning to the tuning-fork shaped terminal of the upper electric power conducting path and the tab terminal of the lower electric power conducting path. However, the embodiment of the present invention may include a case where the positioning part may be independently separated from the frame.

(7) In the above embodiment, the tuning-fork shaped terminal is connected with the tab terminal inside the frame. However, the embodiment of the present invention may include a case where these terminals may be connected outside the frame.

(8) In the above embodiment, the terminals of the lower circuit component are formed with the electric power conducting path in an integrated manner. However, the above-embodiment of the present invention may include a case where the terminals may be apart separated from the electric power conducting path.

(9) In the above embodiment, the positioning hole is provided on upper supporting substrate. However, the above-embodiment of the present invention may include a structure where no positioning hole is provided (structure where terminals of the lower electric power conducting path are not penetrated through the upper supporting substrate).

(10) In the above embodiment, through-holes are provided on the frame. However, the above-embodiment of the present invention may include a structure where terminals may not be penetrated through the frame.

(11) In the above embodiment, a moisture proof agent may be applied to a narrow pitch part on the substrate or a potting agent may be injected into the substrate.

(12) In the above embodiment, the substrates 11, 31 are configured by a printed circuit board.

(13) In the above embodiment, the radiator plate 60 may be a heat radiating panel, heat spreader panel, and a heat transfer panel.

What is claimed is:

1. An electrical connection box comprising:
a plurality of circuit components at least partially overlapped one above the other and substantially parallel with each other, each circuit component having a substrate including a switching member and an electric power conducting path; and
a supporting member that retains the circuit components, wherein the switching member is attached and detached to the substrate and is arrayed on an upper plane of an upper substrate, and
wherein the electric power conducting path of a lower circuit component is provided with a terminal connectable to the switching member by extending above the upper substrate.

2. An electrical connection box according to claim 1, wherein the upper substrate has a positioning hole that allows the terminal to penetrate.

3. An electrical connection box according to claim 1, wherein the supporting member has through-holes that individually allow a plurality of the terminals to penetrate.

4. An electrical connection box according to claim 1, wherein the substrate is configured by a printed circuit board.

5. An electrical connection box according to claim 2, wherein the supporting member has through-holes that individually allow a plurality of the terminals to penetrate.

6. An electrical connection box comprising:
a first circuit component that includes (i) a first substrate and (ii) switches fixed to a surface of the first substrate;
a second circuit component that includes (i) a second substrate and (ii) a plurality of electrical power conductors passing through the second substrate;
a structural frame that receives the first circuit component from a first direction and receives the second circuit component from a second direction, different from the first direction, wherein the first circuit component and the second circuit component at least partially overlapped one above the other and are substantially parallel with each other; and
an upper cover that includes a plurality of relay receptacles and that attaches to the structural frame to cover the second circuit component, whereby the plurality of relay receptacles allow relays to be attached to and detached from the electrical connection box, wherein the electrical power conductors in the second circuit component form a plurality of electrical contacts between the first circuit component and the relay receptacles in the upper cover.

7. An electrical connection box according to claim 6, wherein the second substrate has a positioning hole that allows an electrical power conductor to penetrate the second substrate.

8. An electrical connection box according to claim 6, wherein the supporting member has through-holes that individually allow a plurality of electrical power conductors to penetrate.

9. An electrical connection box according to claim 6, wherein at least one of the first substrate and the second substrate is configured as a printed circuit board.

10. An electrical connection box according to claim 6, wherein the structural frame has through-holes that individually allow a plurality of electrical power conductors to penetrate.

11. An electrical connection box according to claim 6, further comprising:

a plate that attaches to the structural frame to cover the first circuit component.

* * * * *